United States Patent
de la Puente et al.

(10) Patent No.: US 12,293,802 B2
(45) Date of Patent: May 6, 2025

(54) MEMORY QUEUE OPERATIONS TO INCREASE THROUGHPUT IN AN ATE SYSTEM

(71) Applicant: ADVANTEST CORPORATION, Tokyo (JP)

(72) Inventors: Edmundo de la Puente, San Jose, CA (US); Srdjan Malisic, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 18/229,981

(22) Filed: Aug. 3, 2023

(65) Prior Publication Data

US 2024/0096432 A1 Mar. 21, 2024

Related U.S. Application Data

(60) Provisional application No. 63/407,099, filed on Sep. 15, 2022, provisional application No. 63/440,610, filed on Jan. 23, 2023.

(51) Int. Cl.
*G11C 29/36* (2006.01)
*G11C 29/10* (2006.01)

(52) U.S. Cl.
CPC .............. *G11C 29/36* (2013.01); *G11C 29/10* (2013.01); *G11C 2029/3602* (2013.01)

(58) Field of Classification Search
None
See application file for complete search history.

(56) References Cited

U.S. PATENT DOCUMENTS

| 7,424,654 B2 * | 9/2008 | Burke, Jr. ........ G01R 31/31926 |
| | | 714/724 |
| 2006/0248414 A1 * | 11/2006 | Dubey ................... G11C 29/56 |
| | | 714/718 |

(Continued)

FOREIGN PATENT DOCUMENTS

| TW | 201535253 A | 9/2015 |
| TW | 201614509 A | 4/2016 |

OTHER PUBLICATIONS

P. Bernardi and L. Ciganda, "An Adaptive Low-Cost Tester Architecture Supporting Embedded Memory Volume Diagnosis," in IEEE Transactions on Instrumentation and Measurement, vol. 61, No. 4, pp. 1002-1018, Apr. 2012, (Year: 2012).*

*Primary Examiner* — Daniel F. McMahon

(57) ABSTRACT

A tester system includes a test computer system for coordinating and controlling testing of a plurality of devices under test (DUTs), and a hardware interface board coupled to the test computer system and controlled by the test computer system. The hardware interface board is operable to apply test input signals to the plurality of DUTs and operable to receive test output signals from the plurality of DUTs, the hardware interface board including: a processor operable to access test pattern data for application to a DUT. The tester system also includes a memory coupled to the processor and including a plurality of buffers, the plurality of buffers organized into a first-in-first-out (FIFO) memory queue including a buffer front end and a buffer back end, the plurality of buffers operable to receive the test pattern data from the processor at the buffer front end, a direct memory access (DMA) engine coupled to the memory and operable for reading data out of the buffer back end and supplying test pattern data to the DUT, a buffer table for maintaining a buffer sequence within the plurality of buffers and for maintaining vacancy and occupancy information regarding (Continued)

the plurality of buffers, and driver hardware coupled to the DMA engine and operable to receive the test pattern data and for driving the test input signals to the plurality of DUTs.

21 Claims, 5 Drawing Sheets

(56)  References Cited

U.S. PATENT DOCUMENTS

| | | | |
|---|---|---|---|
| 2007/0168817 A1* | 7/2007 | Viens | G01R 31/31935 714/742 |
| 2008/0307276 A1* | 12/2008 | Bodrozic | G01R 31/31716 714/E11.002 |
| 2011/0119016 A1 | 5/2011 | Patel et al. | |
| 2012/0232825 A1* | 9/2012 | Patil | G01R 31/318508 702/117 |
| 2015/0095712 A1* | 4/2015 | Han | G06F 11/273 714/42 |
| 2016/0321153 A1 | 11/2016 | Zhang et al. | |
| 2018/0196103 A1* | 7/2018 | Champoux | G01R 31/31908 |
| 2019/0050324 A1 | 2/2019 | Ellis et al. | |
| 2021/0055347 A1* | 2/2021 | Poppe et al. | G01R 31/318307 |

* cited by examiner

MEMORY QUEUE OPERATIONS TO INCREASE THROUGHPUT IN AN ATE SYSTEM

RELATED APPLICATION

This application claims benefit of, and priority to U.S. Provisional Patent Application 63/407,099, filed Sep. 15, 2022, to De La Puente et al. This application claims benefit of, and priority to U.S. Provisional Patent Application 63/440,610, filed Jan. 23, 2023, to De La Puente et al. This application is related to U.S. patent application Ser. No. 13/773,569, now U.S. Pat. No. 10,162,007, filed Feb. 21, 2013. This application is also related to U.S. patent application Ser. No. 15/914,553, now U.S. Pat. No. 11,009,550, filed Mar. 7, 2018. In addition, this application is related to U.S. patent application Ser. No. 15/982,910, now U.S. Pat. No. 10,288,681, filed May 17, 2018. This application is further related to U.S. patent application Ser. Nos. 17/135,731 and 17/135,790, filed Dec. 28, 2020. All such applications are hereby incorporated herein by reference in their entireties.

FIELD OF INVENTION

Embodiments of the present invention relate to the field of manufacturing and test of electronics. More specifically, embodiments of the present invention relate to systems and methods for memory queue operations to increase throughput in an automated test equipment (ATE) system.

BACKGROUND

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may comprise a complex automated test assembly that may include a custom, dedicated computer control system and many different test instruments that are capable of automatically testing electronics parts and/or semiconductor wafer testing, such as system-on-chip (SOC) testing, integrated circuit testing, network interfaces, and/or solid state drives (SSDs). ATE systems both reduce the amount of time spent on testing devices to ensure that the device functions as designed and serve as a diagnostic tool to determine the presence of faulty components within a given device before it reaches the consumer.

Testing of Devices Under Test (DUTs) generally comprises sending a series of test patterns or "vectors" to stimulate a device, and collecting the device's responses. For complex assemblies, e.g., network interfaces, Universal Serial Bus (USB) adapters, and/or SSDs, such test patterns may take the form of high-level instructions, e.g., "read" or "write," sector addresses, and "data." Under the conventional art, patterns and workloads used to test device have been generated in hardware using an Algorithmic Pattern Generator (APG) and a hardware accelerator. For example, a hardware-based APG would generate a pattern of data, send an instruction to, e.g., an SSD, to write the data to a particular address or range of addresses, and read back the data. The APG would typically collect performance data on the transaction, and compare the written data to the received data to detect errors. This allowed the test systems to generate data at maximum speed of the DUT where the tester did not become the bottleneck.

In addition, under the conventional art, many DUTs operate on a standard "peripheral" interface, for example, Serial Attached SCSI (SAS), Serial AT Attachment (SATA), Serial Peripheral Interface (SPI), Inter-Integrated Circuit (I2C), Universal Serial Bus (USB), and the like. Such interfaces typically require conversion electronics from a more general purpose "main" or "processor" bus, e.g., Peripheral Component Interconnect Express (PCIe).

These designs were typically implemented in a Field-Programmable Gate Array (FPGA) to achieve faster time to market and design flexibility.

Commensurate with their increasing performance, more and computer peripherals are abandoning specialized bus interfaces and adopting "main" bus interfaces, e.g., PCIe. For example, high performance SSDs are migrating from serial AT attachment (SATA) interfaces to "M.2" PCIe interfaces. The FPGAs used in the conventional art testers are incapable of keeping up with the increased data rates required for testing of such emerging devices, and the FPGAs are further challenged to implement main bus protocols, e.g., PCIe "Generation 5" and/or PCIe CXL.

Newer ATE systems may employ high performance processor(s) in place of the above-described FPGAs to generate patterns, instructions, and/or workloads to test DUTs. Such high performance processors may be known as or referred to as "server," "workstation," "High Core Count (HCC)," and/or "enterprise" processors. One example of such a processor is the Intel® Xeon® "Sapphire Rapids" family of processors. Such high performance processors are generally necessary to achieve the data generation and data transfer rates required to test multiple, high-end devices under test (DUTs).

SUMMARY OF THE INVENTION

Embodiments in accordance with the present invention relate to a memory block queue mechanism used to increase throughput to the DUT of test patterns automatically generated by a CPU in the tester system. The invention buffers the write data so that the data can be applied to the DUT at the highest speed. The method organizes the memory as block queues to simultaneously generate new test patterns and use these patterns in a tester. The CPUs generate the data in real-time and it is queued up in memory. This invention enables the use of CPUs for high speed pattern generation.

Conventional DMA techniques and DMA related hardware generally cannot be used with CPU-based Automated Test Pattern Generation (ATPG) because use of DMA presupposes that test data is available a priori in memory for a DMA transfer. However, with CPU-based ATPG, the data is generated in real-time, and hence is not available for DMA. This invention helps with memory bandwidth. The memory queuing scheme can also be modified in real-time.

Therefore, what is needed are systems and methods in testers for memory queue operations to increase throughput in an ATE system. What is additionally needed are systems and methods in testers for memory queue operations to increase throughput in an ATE system that enable software-based changes to tests and test setups. There is a further need for systems and methods in testers for memory queue operations to increase throughput in an ATE system that are compatible and complementary with existing systems and methods of testing electronic devices.

In one implementation, high-memory bandwidth (HBM) techniques may be used to further open up the memory bandwidth.

In accordance with an embodiment of the present invention, a tester system includes a test computer system for coordinating and controlling testing of a plurality of devices under test (DUTs), and a hardware interface board coupled to the test computer system and controlled by the test computer system. The hardware interface board is operable to apply test input signals to the plurality of DUTs and operable to receive test output signals from the plurality of DUTs, the hardware interface board including: a processor operable to access test pattern data for application to a DUT. The tester system also includes a memory coupled to the processor and including a plurality of buffers, the plurality of buffers organized into a first-in-first-out (FIFO) memory queue including a buffer front end and a buffer back end, the plurality of buffers operable to receive the test pattern data from the processor at the buffer front end, a direct memory access (DMA) engine coupled to the memory and operable for reading data out of the buffer back end and supplying test pattern data to the DUT, a buffer table for maintaining a buffer sequence within the plurality of buffers and for maintaining vacancy and occupancy information regarding the plurality of buffers, and driver hardware coupled to the DMA engine and operable to receive the test pattern data and for driving the test input signals to the plurality of DUTs.

Embodiments include the above and further include wherein the processor comprises a High Core Count (HCC) processor.

Embodiments include the above and further include wherein each buffer of the plurality of buffers is approximately 32 Megabytes in size.

Embodiments include the above and further include wherein the plurality of buffers is approximately 16 Gigabytes in size.

Embodiments include the above and further include wherein the DMA engine reads the data from the FIFO memory queue at a first speed and wherein the processor fills the FIFO memory queue at a second speed and wherein the first speed is faster than the second speed.

Embodiments include the above and further include wherein the HCC processor supports PCIE protocol and wherein the hardware interface board communicates with the plurality of DUTs using PCIE.

Embodiments include the above and further include wherein the HCC processor comprises N number of cores and wherein N is scalable based on a prescribed testing performance.

Embodiments include the above and further include wherein the test pattern data is algorithmically generated by the processor.

Embodiments include the above and further include wherein the processor pauses filling the FIFO memory queue when the FIFO memory queue is full and wherein the DMA engine pauses reading data out from the FIFO memory queue when the FIFO memory queue is empty.

In accordance with another embodiment of the present invention, a tester system includes a test computer system for coordinating and controlling testing of a plurality of devices under test (DUTs), and a hardware interface board coupled to the test computer system and controlled by the test computer system, the hardware interface board operable to apply test input signals to the plurality of DUTs and operable to receive test output signals from the plurality of DUTs, the hardware interface board including a microprocessor operable to automatically generate test pattern data for application to a DUT, a memory coupled to the microprocessor and including a plurality of buffers, the plurality of buffers organized into a first-in-first-out (FIFO) memory queue including a buffer front end and a buffer back end, the plurality of buffers operable to receive the test pattern data from the processor at the buffer front end at a first rate, a direct memory access (DMA) engine coupled to the memory and operable for reading data out of the buffer back end and supplying test pattern data to the DUT at a second rate wherein the second rate is faster than the first rate, a buffer table for maintaining a buffer sequence within the plurality of buffers, for maintaining vacancy and occupancy information regarding the plurality of buffers and including pointers for indicating the buffer front end and the buffer back end, and driver hardware coupled to the DMA engine and operable to receive the test pattern data and for driving the test input signals to the plurality of DUTs.

Embodiments include the above and further include wherein the microprocessor comprises a High Core Count (HCC) processor.

Embodiments include the above and further include wherein each buffer of the plurality of buffers is approximately 32 Megabytes in size.

Embodiments include the above and further include wherein the plurality of buffers is approximately 16 Gigabytes in size.

Embodiments include the above and further include wherein the HCC processor supports PCIE protocol and wherein the hardware interface board communicates with the plurality of DUTs using PCIE.

Embodiments include the above and further include wherein the HCC processor comprises N number of cores and wherein N is scalable based on a prescribed testing performance.

Embodiments include the above and further include wherein the test pattern data comprises a plurality of test vectors that are algorithmically generated by the microprocessor.

Embodiments include the above and further include wherein the microprocessor pauses filling the FIFO memory queue when the FIFO memory queue is full and wherein the DMA engine pauses reading data out from the FIFO memory queue when the FIFO memory queue is empty.

In accordance with a method embodiment of the present invention, a method for testing a device under test (DUT) with a tester system includes using a microprocessor to automatically generate a plurality of test pattern vectors for application to the DUT, filling a first-in-first-out (FIFO) buffer element at a first end with the test pattern vectors generated by the microprocessor, wherein a plurality of buffers of the FIFO buffer element are filled with data, draining the FIFO buffer element at a second end using a direct memory access (DMA) engine wherein the draining is performed faster than the filing, applying test pattern vectors drained from the FIFO buffer element to the DUT for testing thereof, pausing generating of the test pattern vectors and pausing the filling of the FIFO buffer element upon the FIFO buffer element becoming full, and pausing draining of the FIFO buffer element upon the FIFO buffer element becoming empty.

Embodiments include the above and further wherein each buffer of the plurality of buffers is approximately 32 Megabytes in size and wherein the FIFO buffer element is approximately 16 Gigabytes in size.

Embodiments include the above and further comprise maintaining a buffer table for indicating a buffer sequence of the FIFO buffer element, for indicating buffer vacancy information concerning the FIFO buffer element and for indicating pointers for defining the front end and the back end of the FIFO buffer element.

In accordance with another embodiment of the present invention, A data storage and retrieval system for a computer memory, includes a computer processor for configuring the memory according to a queue structure. The queue structure includes a plurality of buffers, each of the buffers including a tag field and a data field. One of the plurality of buffers is configured for filling by the computer processor while another of the plurality of buffers is transferred to a device under test (DUT) by direct memory access (DMA).

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Figure 1:
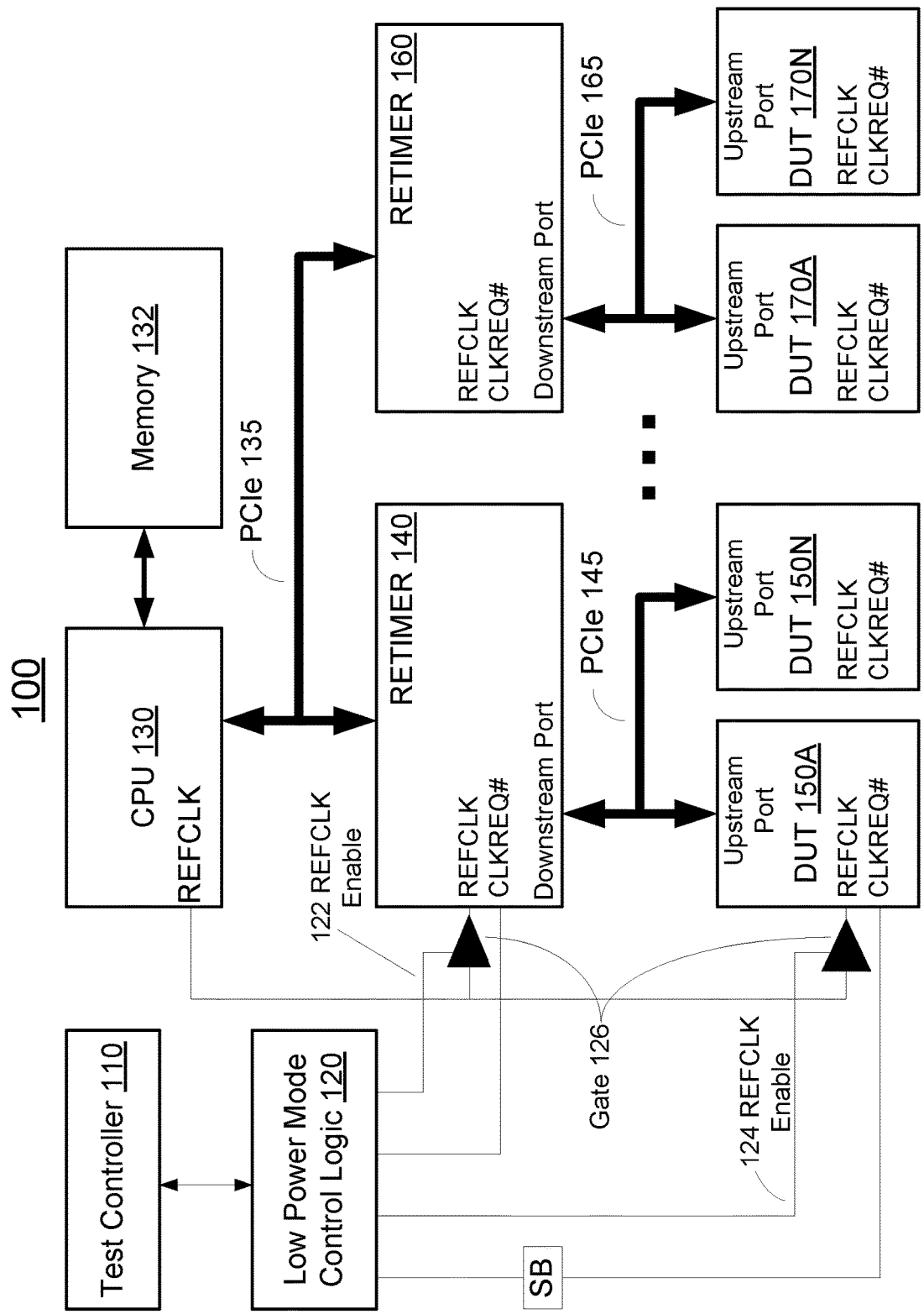
FIG. 1 illustrates an exemplary block diagram of an exemplary system for memory queue operations in testers to increase throughput in an ATE system, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow (e.g., method 400) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "applying" or "controlling" or "generating" or "testing" or "heating" or "bringing" or "capturing" or "storing" or "reading" or "analyzing" or "resolving" or "accepting" or "selecting" or "determining" or "displaying" or "presenting" or "computing" or "sending" or "receiving" or "reducing" or "detecting" or "setting" or "accessing" or "placing" or "forming" or "mounting" or "removing" or "ceasing" or "stopping" or "coating" or "processing" or "performing" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in *In re Nuijten,* 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

In the following descriptions, various elements and/or features of embodiments in accordance with the present invention are presented in isolation so as to better illustrate such features and as not to unnecessarily obscure aspects of the invention. It is to be appreciated, however, that such features, e.g., as disclosed with respect to a first drawing, may be combined with other features disclosed in other drawings in a variety of combinations. All such embodiments are anticipated and considered, and may represent embodiments in accordance with the present invention.

Exemplary embodiments in accordance with the present invention are generally presented herein as relating to a Peripheral Component Interconnect Express (PCIe) computer expansion bus standard. It is to be appreciated that embodiments in accordance with the present invention are not limited to the illustrated PCIe embodiments. Rather, embodiments in accordance with the present invention are well suited to use with a wide range of other well-known computer expansion busses, including, for example, Compute Express Link (CXL), InfiniBand, RapidIO, HyperTransport, Intel QuickPath Interconnect, VMEbus (ANSI/IEEE 1014-1987), and/or Mobile Industry Processor Interface (MIPI), and such embodiments are considered within the scope of the present invention.

Memory Queue Operations to Increase Throughput in an ATE System

FIG. 1 illustrates an exemplary block diagram of an exemplary system 100 for memory queue operations in testers to increase throughput in an ATE system, in accordance with embodiments of the present invention. Test system 100 comprises a test controller 110, which may be, for example, a general-purpose computer system with special programming for the test application. Test system 100 also comprises a CPU 130. CPU 130 may comprise bus, e.g., PCIe, support components, including additional integrated circuit devices, in some embodiments. CPU 130 may be known as or referred to as "server," "workstation," "High Core Count (HCC)," and/or "enterprise" processors. One example of such a processor is the Intel® Xeon® "Sapphire Rapids" family of processors. CPU 130 may comprise 16 to 32 cores, in some embodiments. In some embodiments, CPU 130 may comprise more than 32 cores. For example, processors comprising 56 cores are currently available. In some embodiments, the number of cores in CPU 130 may be scalable, or selected, based on a prescribed testing performance.

CPU 130 is coupled to memory 132. Memory 132 may comprise high bandwidth memory (HBM), in some embodiments. Memory 132 may be coupled to CPU 130 in any well-known manner. For example, memory 132 may be directly coupled to CPU 130, memory 132 may be coupled to CPU 130 via a "chip set," and/or memory 132 may be coupled to CPU 130 via bus 135.

CPU 130 is functionally coupled to PCIe bus 135. CPU 130, or other associated bus control components, may generate a signal REFCLK, in some embodiments. In some embodiments, REFCLK may be provided by other sources, e.g., a clock module, as is known for a variety of PCIe embodiments.

The PCIe standard specifies a 100 MHz clock (REFCLK) with at least ±300 ppm frequency stability for Generation 1, 2, 3 and 4, and at least ±100 ppm frequency stability for Generation 5, at both the transmitting and receiving devices. As will be further discussed below, REFCLK plays an important role in PCIe low power modes.

CPU 130 is coupled via PCIe bus 135 to a plurality of retimers, e.g., retimers 140, 160. The number of retimers illustrated is exemplary. In general, PCIe retimers are signal conditioning devices that actively participate in the PCIe protocol to facilitate communication between a root complex, e.g., PCIe bus 135, and an endpoint, e.g., PCIe bus 145. By providing improved signal integrity in a system, retimers increase the maximum allowable PCIe trace length and allow for more flexibility in system design. Exemplary retimers may include the PT5161L PCI Express® Retimer, commercially available from Astera Labs, Santa Clara, California, USA.

The retimer 140 produces PCIe bus 145, which functionally mirrors PCIe bus 135. For example, devices coupled to PCIe bus 145 are functionally coupled to devices on PCIe bus 135, e.g., CPU 130. Similarly, retimer 160 produces PCIe bus 165, which functionally mirrors PCIe bus 135.

A plurality of devices under test (DUTs), e.g., DUT 150A to DUT 150N, are coupled to PCIe bus 145. Similarly, a devices under test (DUTs), e.g., DUT 150A to DUT 150N, are coupled to PCIe bus 165. In some embodiments, eight DUTs may be coupled to a single CPU, e.g., CPU 130. In some embodiments, additional CPUs may be coupled to additional retimers and additional DUTs in a similar manner as illustrated in FIG. 1. For example, in a two CPU embodiment, there may be four retimers, e.g., two per CPU, and 16 DUTs, e.g., eight per CPU.

CPU 130 is configured, e.g., via software, to test the electrical and functional performance and characteristics of a device under test, e.g., DUT 150A. For example, CPU generates data and commands to be sent to a DUT, and receives results from the DUT.

In an exemplary Solid State Drive (SSD) DUT embodiment, CPU 130 may issue a "write" command to a SSD DUT, via PCIe bus 135. The CPU 130 may send, or write, a large amount of data to the SSD to be saved by the SSD. The CPU 130 may generate the data via an algorithm, or algorithmic pattern generator (APG) software operating on the CPU 130, in some embodiments. In some embodiments, the CPU 130 may access the data from a computer readable media, e.g., DRAM, coupled to the CPU 130. The CPU 130 will typically issue a "read" command to the SSD to read back the data previously written. In some embodiments, the CPU 130 may cause data to be sent and/or received directly from/to a memory to/from a DUT, e.g., via direct memory access (DMA). The CPU 130 may compare the data sent to the SSD with the data received from the SSD to confirm correct operation and/or to determine erroneous operation of the SSD.

In some embodiments, test system 100 may also perform electrical, power, and/or environmental testing on the plurality of DUTs. Such testing is known in the MPT3000 test system, commercially available from Advantest America, Inc., of San José, California, USA.

Test system 100 is well-suited to testing any device that is adapted to operate on the main bus, e.g., a PCIe bus. Such exemplary devices may include, for example, SSDs, DRAM modules, interfaces to rotating media, e.g., optical drives and magnetic hard drives (HDDs), RAID (Redundant Array of Independent Disks) controllers, network interface cards (NICs), including LAN, e.g., WIFI, wide area network (WAN), and/or fiber-optic interconnects, graphics cards, sound cards, modems, scanners, video capture cards, USB interfaces, Secure Digital (SD) Card interfaces, TV tuners, and the like.

PCIe Generation 5 has implemented what is known as or referred to as "L1 sub-states" to its power control regime. A new function is added to the PCIe pin "CLKREQ #" to provide a signaling protocol. This allows the PCIe transceivers to turn off their high-speed circuits and rely on the new signaling to wake them up again. Two new sub-states were defined: L1.1 and L1.2 providing their own power vs. exit latency trade-off choices. The L1.1 sub-state is intended for resumption times on the order of 20 microseconds (5 to 10 times longer than the L1 state allowed), while the L1.2 sub-state targets times on the order of 100 microseconds (up to 50 times longer than allowed for L1). Both L1.1 and L1.2 permit the PCIe transceivers to turn off their phase locked loops (PLLs) along with their receivers and transmitters, while L1.2 allows turning off common mode keeper circuits.

To implement the L1.1 and/or the L1.2 low power states, both the "upstream" and "downstream" ports may monitor the logical state of the CLKREQ #signal. It is appreciated that CPU 130 does not support the L1 low power sub-states (L1.1, L1.2). CPU 130 is not illustrated as accessing the CLKREQ #signal/pin. Hence, CPU 130 cannot natively support the L1.1 and/or L1.2 low power modes. However, a wide range of computer peripheral devices want to take advantage of the L1 low power sub-states. For example, such devices are intended for use in systems for which power consumption is important, e.g., in laptop computer systems. In order to test these modes, test system 100 comprises low power mode control logic 120.

Low power mode control logic 120 exists separately from CPU 130, and may be controlled by test controller 110, in some embodiments. Low power mode control logic 120 functions to control the reference clock REFCLK in response to the CLKREQ #signal. Low power mode control logic 120 comprises storage locations, e.g., register bits, to indicate whether the L1 sub-states are enabled. These registers are further described with respect to FIG. 5, below. If the L1.1 state is enabled and the L1.2 state is not enabled, low power mode control logic 120 will respond to deassertion of the CLKREQ #signal by disabling the REFCLK using and by disabling Electrical Idle detect circuits. Any device on the PCIe bus, e.g., retimer 140 and/or DUT 150A, may request a L1 sub-state low power mode by deasserting CLKREQ #. In some embodiments, test controller 110 may command low power mode control logic 120 to enter a L1 sub-state low power mode by deasserting CLKREQ #. In response to the deassertion of CLKREQ #, low power mode control logic 120 will deassert signals 122 and 124 REFCLK enable, which will turn off gates 126, and not allow the REFCLK signal to propagate to the devices, e.g., retimer 140 and/or DUT 150A. In some embodiments, gates 126 may be tri-state buffers.

If the L1.2 enable bit is set, the L1.2 sub-state is entered in response to deassertion of the CLKREQ #signal.

Test system 100 may perform a variety of tests and/or measurements related to a DUT entering and exiting a low power mode. For example, test system 100 may measure power consumption while a DUT is in low power mode. Test system 100 may also measure latency for a DUT to come out of low power mode(s) until the DUT is partially and/or fully functional. It is appreciated that CPU 130 may not implement and/or execute a variety of low power modes while testing a plurality of DUTs. For example, CPU 130 may be required to execute instructions and/or perform other operations while a DUT is in low power mode.

Under the conventional art, DUTs were coupled to a hardware bus adapter socket which converted a main computer expansion bus, e.g., PCIe, to a more specialized peripheral bus, e.g., Universal Serial Bus (USB), Serial Attached SCSI (SAS), and/or Serial AT Attachment (SATA) etc., as used by the DUT. In accordance with embodiments of the present invention, a DUT is coupled to a main computer expansion bus, e.g., PCIe.

Testing of certain Devices Under Test (DUTs), for example, high capacity and/or high data rate devices, e.g., solid state drives (SSDs), may require vast amounts of data and/or data transfers. For example, SSDs capable of storing many terabytes are commercially available. In contrast, computer memories, e.g., DRAM, are typically orders of magnitude smaller, e.g., measured in gigabytes. Conventional CPU-based Automated Test Pattern Generation (ATPG) is generally not fast enough to generate enough data and/or to support the desired transfer rates for testing certain devices.

In accordance with embodiments of the present invention, a plurality of relatively small, e.g., 32 MB, buffers are filled with data. Other buffer sizes are well suited to embodiments in accordance with the present invention. These buffers comprise test data, e.g., patterns and/or random data, for writing to a DUT, e.g., an SSD. The test data may be generated by an Automated Test Pattern Generation (ATPG) process running on multiple cores of a CPU, e.g., CPU 130. Test data patterns may include, for example, random data, "walking" ones patterns, data equals address patterns, maximum frequency, e.g., alternating ones and zeros, patterns, electromagnetic compatibility (EMC) test patterns, and the like. These buffers also comprise tags and/or meta data, including, for example, write address(es), DUT commands, and/or error correction code (ECC) information. The plurality of buffers is arranged in a first in, first out (FIFO) queue within processor memory, e.g., memory 132 (FIG. 1). The plurality of buffers may be continuous in physical or virtual memory in some embodiments, although that is not required. The plurality of buffers may comprise a linked list(s), in some embodiments.

Prior to initiating a data transfer to a DUT, at least one such buffer may be filled with test data and tags. A direct memory access (DMA) engine, e.g., within processor 130, will send data from a first buffer to a DUT via a first DMA operation. In some embodiments, a DMA engine may be external to processor 130. In parallel, the processor 130 will fill a second buffer with data and tags. As the first DMA operation completes, a second DMA operation will be initiated to send data from the second buffer to the DUT. The test may utilize any number of buffers as appropriate for the amount of attached memory, e.g., DRAM, and the number of DUTs.

After a final buffer has been filled, a previously-used buffer, e.g., the first buffer, may be refilled with potentially different data and/or tags. For example, the tags may be changed such that the buffer is written to a different address of the DUT. In some embodiments, the data within a buffer may be unchanged for a subsequent use. In some embodiments, the data within a buffer may be different, e.g., as regenerated by an Automated Test Pattern Generation (ATPG), for a subsequent use of the buffer.

For tests that read data from a DUT, e.g., an SSD, the plurality of buffers are used in a similar manner. For example, tag data, e.g., comprising a read command, is sent to the DUT. The read data is transferred via DMA to the data portion of the buffer. The CPU is able to inspect the buffer, e.g., to compute a cyclic redundancy check (CRC) value on the entire buffer, and/or to verify each byte.

In accordance with embodiments of the present invention, a byte by byte comparison may be made with the read data by comparing the read date with data generated by a data-generating algorithm. In other embodiments. A read data buffer may be compared with a write buffer. Such a buffer-to-buffer comparison may be faster than running a data-generating algorithm.

It is appreciated that SSDs, for example, are considered random-access devices. For example, an SSD may be written and read randomly, e.g., with sector-level granularity. For example, sector 100 may be written in one operation, and sector 234 may be written in the next operation. In accordance with embodiments of the present invention, the buffer and tag structure may support any level of address-granularity desired.

Figure 2:
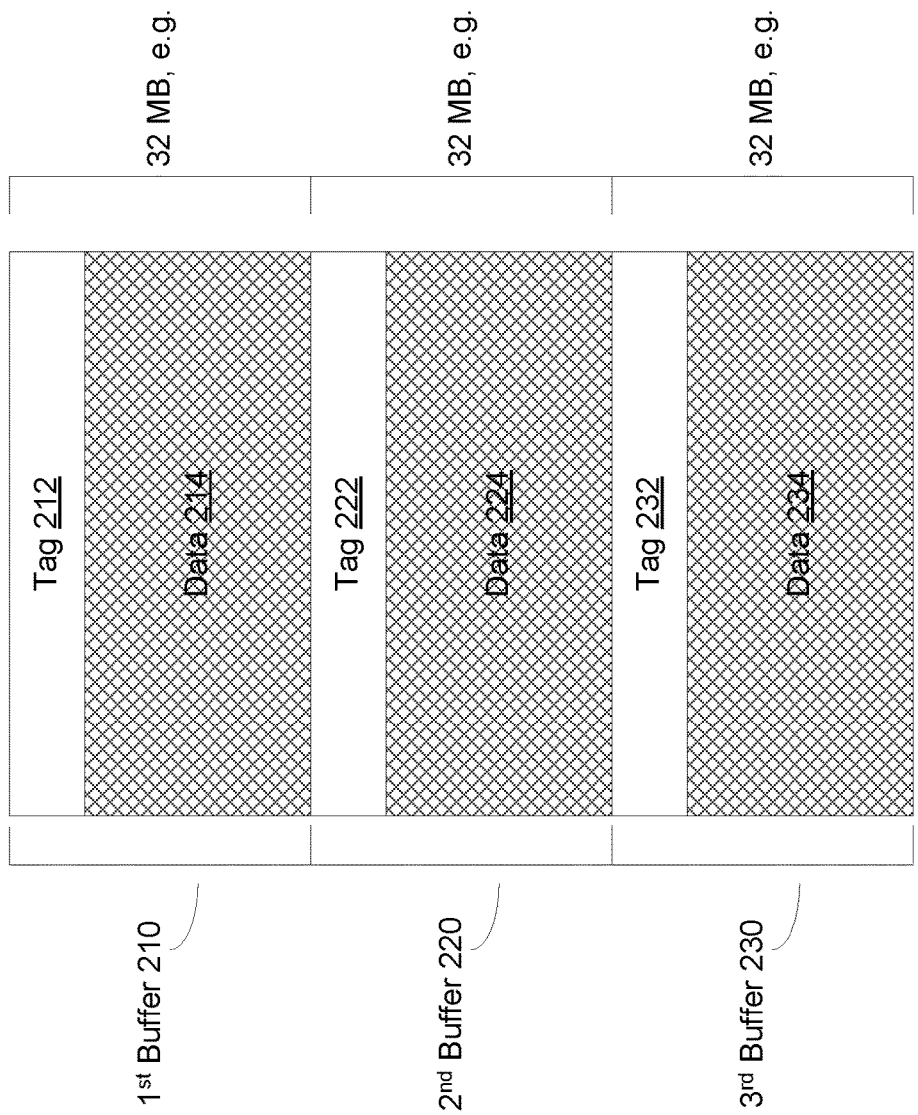
FIG. 2 illustrates an exemplary memory queue, in accordance with embodiments of the present invention.

FIG. 2 illustrates an exemplary memory queue 200, in accordance with embodiments of the present invention. Memory queue 200 comprises three buffers, first buffer 210, second buffer 220, and third buffer 230. The number and size of the buffers is exemplary. Each buffer 210, 220, 230, comprises tag information 212, 222, 224, e.g., write address(es), DUT commands, and/or error correction code (ECC) information. Each buffer 210, 220, 230, comprises a data portion, 214, 22, 234. Memory queue 200 may generally be located within computer main memory, e.g., memory 132 (FIG. 1).

Figure 3:
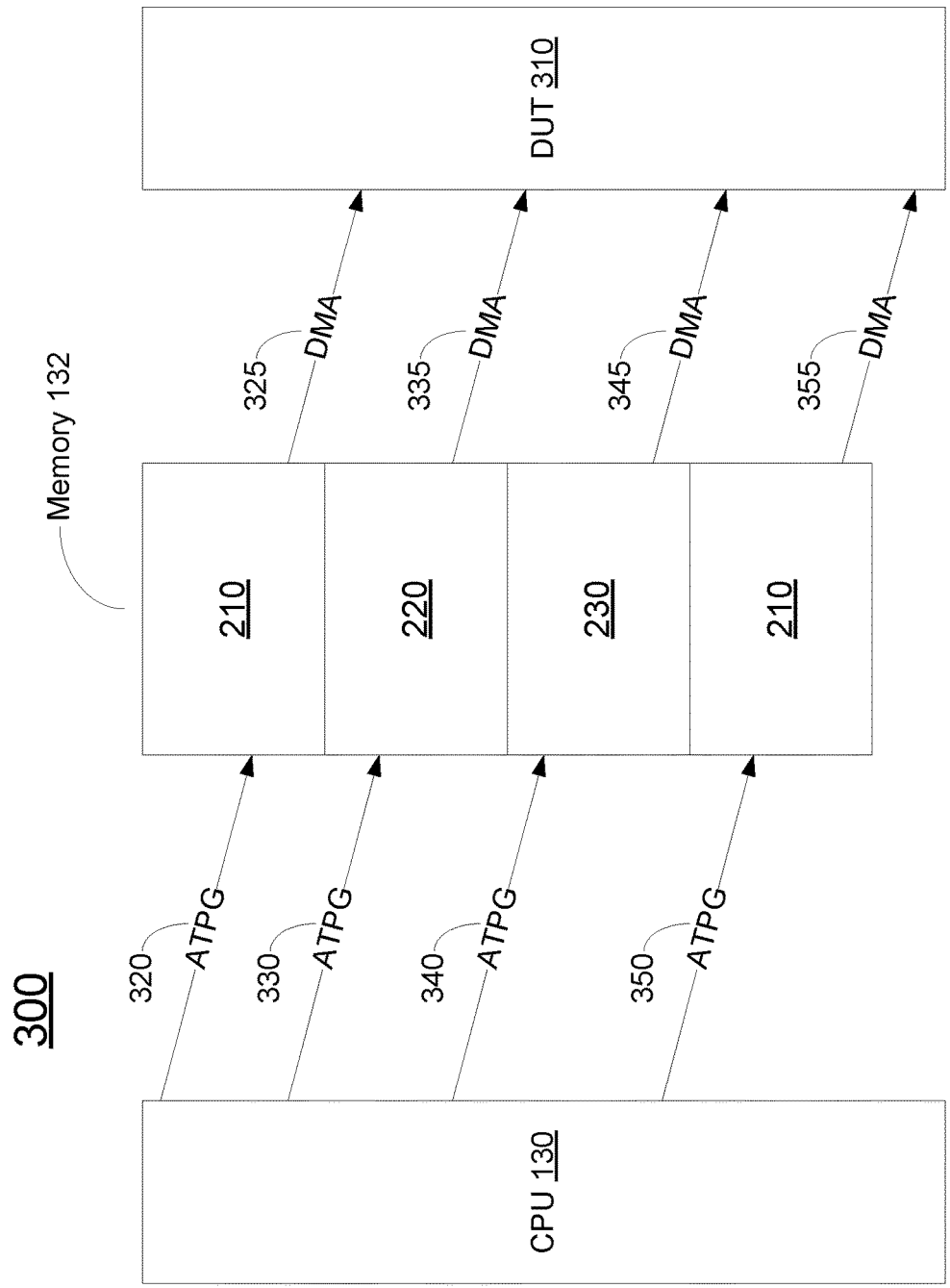
FIG. 3 illustrates an exemplary data flow diagram, in accordance with embodiments of the present invention.

FIG. 3 illustrates an exemplary data flow diagram 300, in accordance with embodiments of the present invention. CPU 130 generates first data and tags via ATPG 320 into first buffer 210 of memory 132. When first buffer 210 is filled, the data and commands are transferred via DMA 325 to DUT 310, e.g., a SSD. In parallel with DMA 325, CPU 130 generates second data and tags via ATPG 330 into second buffer 220 of memory 132. When second buffer 220 is filled, the data and commands are transferred via DMA 335 to DUT 310. Similarly, in parallel with DMA 335, CPU 130 generates third data and tags via ATPG 340 into third buffer 230 of memory 132. When third buffer 230 is filled, the data and commands are transferred via DMA 345 to DUT 310. In the exemplary embodiment of FIG. 3, there are only three buffers, 210, 220, and 230. In parallel with DMA 345, CPU 130 generates fourth data and tags via ATPG 350 into first buffer 210 of memory 132, reusing first buffer 210. When first buffer 210 is filled, the data and commands are transferred via DMA 355 to DUT 310, e.g., a SSD.

Figure 4:
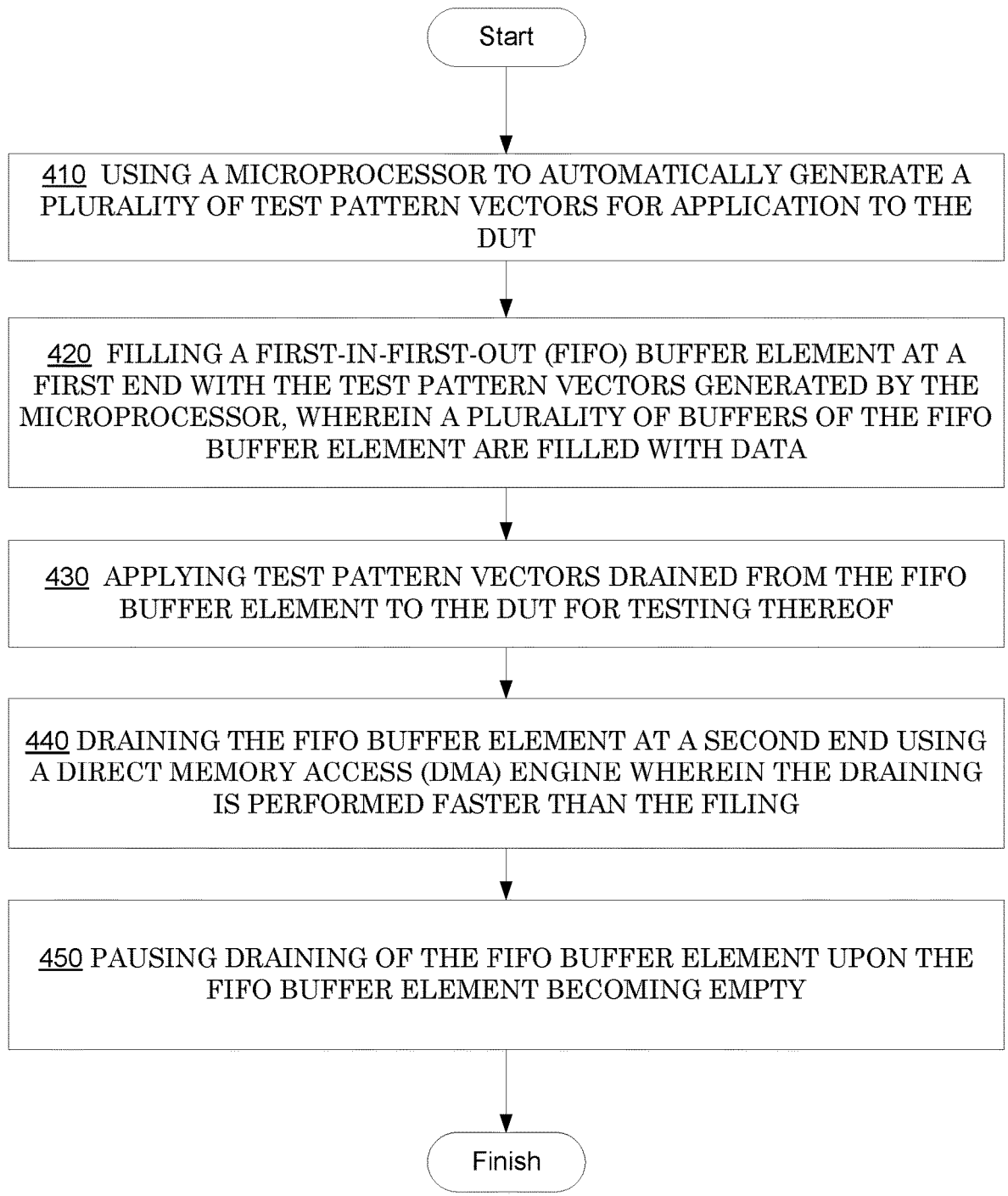
FIG. 4 illustrates an exemplary method for testing a device under test (DUT) with a tester system, in accordance with embodiments of the present invention.

FIG. 4 illustrates an exemplary method 400 for testing a device under test (DUT) with a tester system, in accordance with embodiments of the present invention. In 410, using a microprocessor, a plurality of test pattern vectors are generated for application to the DUT. In 420, a first-in-first-out (FIFO) buffer element at a first end is filled with the test pattern vectors generated by the microprocessor, wherein a plurality of buffers of the FIFO buffer element are filled with data. The FIFO buffer element is drained at a second end using a direct memory access (DMA) engine wherein the draining is performed faster than the filing. In 430, the test pattern vectors drained from the FIFO buffer element are applied to the DUT for testing thereof. In 450, generating of the test pattern vectors and the filling of the FIFO buffer element is paused upon the FIFO buffer element becoming full, and pausing draining of the FIFO buffer element upon the FIFO buffer element becoming empty.

In this novel manner, test patterns may be generated by a CPU under software control, and simultaneously sent to a DUT, enabling flexibility in test design and implementation not available under the conventional art.

Figure 5:
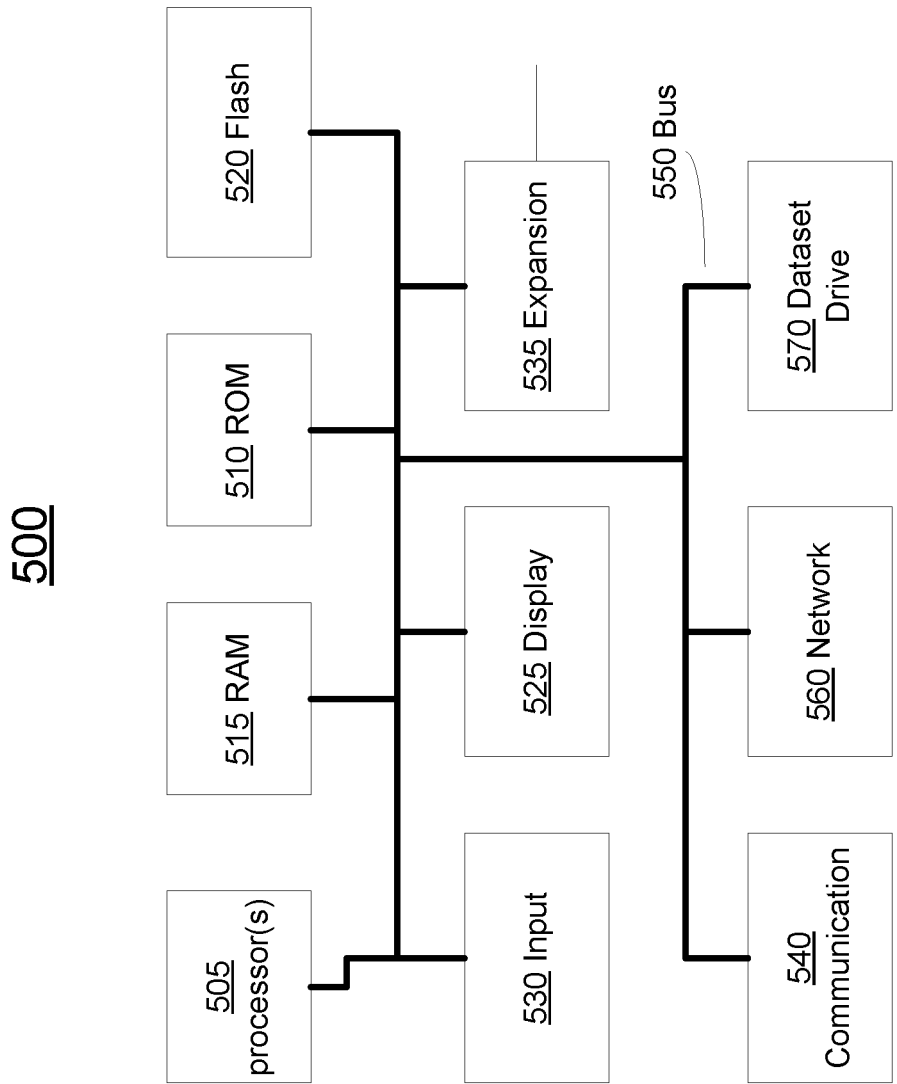
FIG. 5 illustrates a block diagram of an exemplary electronic system, which may be used as a platform to implement and/or as a control system for embodiments of the present invention.

FIG. 5 illustrates a block diagram of an exemplary electronic system 500, which may be used as a platform to implement and/or as a control system, e.g., system controller 110 and/or CPU 130, as described in FIG. 1, for embodiments of the present invention. Electronic system 500 may be a "server" computer system, in some embodiments. Electronic system 500 includes an address/data bus 550 for communicating information, a central processor complex 505 functionally coupled with the bus for processing information and instructions. Bus 550 may comprise, for example, a Peripheral Component Interconnect Express (PCIe) computer expansion bus, industry standard architecture (ISA), extended ISA (EISA), MicroChannel, Multibus, IEEE 596, IEEE 1196, IEEE 1496, PCI, Computer Automated Measurement and Control (CAMAC), MBus, Runway bus, Compute Express Link (CXL), and the like.

Central processor complex 505 may comprise a single processor or multiple processors, e.g., a multi-core processor, or multiple separate processors, in some embodiments. Central processor complex 505 may comprise various types of well-known processors in any combination, including, for example, digital signal processors (DSP), graphics processors (GPU), complex instruction set (CISC) processors, reduced instruction set (RISC) processors, and/or very long word instruction set (VLIW) processors. In some embodiments, exemplary central processor complex 505 may comprise a finite state machine, for example, realized in one or more field programmable gate array(s) (FPGA), which may operate in conjunction with and/or replace other types of processors to control embodiments in accordance with the present invention.

Electronic system 500 may also include a volatile memory 515 (e.g., random access memory RAM) coupled with the bus 550 for storing information and instructions for the central processor complex 505, and a non-volatile memory 510 (e.g., read only memory ROM) coupled with the bus 550 for storing static information and instructions for the processor complex 505. Electronic system 500 also optionally includes a changeable, non-volatile memory 520 (e.g., NOR flash) for storing information and instructions for the central processor complex 505 which can be updated after the manufacture of system 500. In some embodiments, only one of ROM 510 or Flash 520 may be present.

Also included in electronic system 500 of FIG. 5 is an optional input device 530. Device 530 can communicate information and command selections to the central processor 500. Input device 530 may be any suitable device for communicating information and/or commands to the electronic system 500. For example, input device 530 may take the form of a keyboard, buttons, a joystick, a track ball, an audio transducer, e.g., a microphone, a touch sensitive digitizer panel, eyeball scanner, and/or the like.

Electronic system 500 may comprise a display unit 525. Display unit 525 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 525 may have an associated lighting device, in some embodiments.

Electronic system 500 also optionally includes an expansion interface 535 coupled with the bus 550. Expansion interface 535 can implement many well known standard expansion interfaces, including without limitation the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 1394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 535 may comprise signals substantially compliant with the signals of bus 550.

A wide variety of well-known devices may be attached to electronic system 500 via the bus 550 and/or expansion interface 535. Examples of such devices include without limitation rotating magnetic memory devices, flash memory devices, digital cameras, wireless communication modules, digital audio players, and Global Positioning System (GPS) devices.

System 500 also optionally includes a communication port 540. Communication port 540 may be implemented as part of expansion interface 535. When implemented as a separate interface, communication port 540 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 1394, and synchronous ports.

System 500 optionally includes a network interface 560, which may implement a wired or wireless network interface. Electronic system 500 may comprise additional software and/or hardware features (not shown) in some embodiments.

Various modules of system 500 may access computer readable media, and the term is known or understood to include removable media, for example, Secure Digital ("SD") cards, CD and/or DVD ROMs, diskettes and the like, as well as non-removable or internal media, for example, hard drives, solid state drives (SSD), RAM, ROM, flash, and the like.

Embodiments in accordance with the present invention provide systems and methods in testers for memory queue operations to increase throughput in an ATE system. In addition, embodiments in accordance with the present invention provide systems and methods in testers for memory queue operations to increase throughput in an ATE system that enable software-based changes to tests and test setups. Further, embodiments in accordance with the present invention provide systems and methods in testers for memory queue operations to increase throughput in an ATE system that are compatible and complementary with existing systems and methods of testing electronic devices.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

What is claimed is:

1. A tester system comprising:
a test computer system for coordinating and controlling testing of a plurality of devices under test (DUTs); and
a hardware interface board coupled to said test computer system and controlled by said test computer system, said hardware interface board operable to apply test input signals to said plurality of DUTs and operable to receive test output signals from said plurality of DUTs, said hardware interface board comprising:
a processor operable to access test pattern data for application to a DUT;
a memory coupled to said processor and comprising a plurality of buffers, said plurality of buffers organized into a first-in-first-out (FIFO) memory queue comprising a buffer front end and a buffer back end, said plurality of buffers operable to receive said test pattern data from said processor at the buffer front end;
a direct memory access (DMA) engine coupled to said memory and operable for reading data out of said buffer back end and supplying test pattern data to said DUT;
a buffer table for maintaining a buffer sequence within said plurality of buffers and for maintaining vacancy and occupancy information regarding said plurality of buffers; and
driver hardware coupled to said DMA engine and operable to receive said test pattern data and for driving said test input signals to said plurality of DUTs.

2. The tester system as described in claim 1 wherein said processor comprises a High Core Count (HCC) processor.

3. The tester system as described in claim 1 wherein each buffer of said plurality of buffers is approximately 32 Megabytes in size.

4. The tester system as described in claim 3 wherein said plurality of buffers is approximately 16 Gigabytes in size.

5. The tester system as described in claim 1 wherein said DMA engine reads said data from said FIFO memory queue at a first speed and wherein said processor fills said FIFO memory queue at a second speed and wherein said first speed is faster than said second speed.

6. The tester system as described in claim 2 wherein said HCC processor supports PCIE protocol and wherein said hardware interface board communicates with said plurality of DUTs using PCIE.

7. The tester system as described in claim 2 wherein said HCC processor comprises N number of cores and wherein N is scalable based on a prescribed testing performance.

8. The tester system as described in claim 5 wherein said test pattern data is algorithmically generated by said processor.

9. The tester system as described in claim 5 wherein said processor pauses filling said FIFO memory queue when said FIFO memory queue is full and wherein said DMA engine pauses reading data out from said FIFO memory queue when said FIFO memory queue is empty.

10. A tester system comprising:
a test computer system for coordinating and controlling testing of a plurality of devices under test (DUTs); and
a hardware interface board coupled to said test computer system and controlled by said test computer system, said hardware interface board operable to apply test input signals to said plurality of DUTs and operable to receive test output signals from said plurality of DUTs, said hardware interface board comprising:
a microprocessor operable to automatically generate test pattern data for application to a DUT;
a memory coupled to said microprocessor and comprising a plurality of buffers, said plurality of buffers organized into a first-in-first-out (FIFO) memory queue comprising a buffer front end and a buffer back end, said plurality of buffers operable to receive said test pattern data from said microprocessor at the buffer front end at a first rate;
a direct memory access (DMA) engine coupled to said memory and operable for reading data out of said buffer back end and supplying test pattern data to said DUT at a second rate wherein said second rate is faster than said first rate;
a buffer table for maintaining a buffer sequence within said plurality of buffers, for maintaining vacancy and occupancy information regarding said plurality of buffers and comprising pointers for indicating said buffer front end and said buffer back end; and
driver hardware coupled to said DMA engine and operable to receive said test pattern data and for driving said test input signals to said plurality of DUTs.

11. The tester system as described in claim 10 wherein said microprocessor comprises a High Core Count (HCC) processor.

12. The tester system as described in claim 10 wherein each buffer of said plurality of buffers is approximately 32 Megabytes in size.

13. The tester system as described in claim 12 wherein said plurality of buffers is approximately 16 Gigabytes in size.

14. The tester system as described in claim 11 wherein said HCC processor supports PCIE protocol and wherein said hardware interface board communicates with said plurality of DUTs using PCIE.

15. The tester system as described in claim 11 wherein said HCC processor comprises N number of cores and wherein N is scalable based on a prescribed testing performance.

16. The tester system as described in claim 10 wherein said test pattern data comprises a plurality of test vectors that are algorithmically generated by said microprocessor.

17. The tester system as described in claim 11 wherein said microprocessor pauses filling said FIFO memory queue when said FIFO memory queue is full and wherein said DMA engine pauses reading data out from said FIFO memory queue when said FIFO memory queue is empty.

18. A method of testing a device under test (DUT) with a tester system, said method comprising:

using a microprocessor to automatically generate a plurality of test pattern vectors for application to said DUT;

filling a first-in-first-out (FIFO) buffer element at a first end with said test pattern vectors generated by said microprocessor, wherein a plurality of buffers of said FIFO buffer element are filled with data;

draining said FIFO buffer element at a second end using a direct memory access (DMA) engine wherein said draining is performed faster than said filling;

applying test pattern vectors drained from said FIFO buffer element to said DUT for testing thereof;

pausing generating of said test pattern vectors and pausing the filling of said FIFO buffer element upon said FIFO buffer element becoming full; and pausing draining of said FIFO buffer element upon said FIFO buffer element becoming empty.

19. The method of testing as described in claim 18 wherein each buffer of said plurality of buffers is approximately 32 Megabytes in size and wherein said FIFO buffer element is approximately 16 Gigabytes in size.

20. The method of testing as described in claim 18 further comprising maintaining a buffer table for indicating a buffer sequence of said FIFO buffer element, for indicating buffer vacancy information concerning said FIFO buffer element and for indicating pointers for defining a front end and a back end of said FIFO buffer element.

21. A data storage and retrieval system for a computer memory, comprising:

a computer processor for configuring said memory according to a queue structure, said queue structure comprising:

a plurality of buffers, each said buffers including a tag field and a data field, and wherein one of the plurality of buffers is configured for filling by the computer processor while another of the plurality of buffers is transferred to a device under test (DUT) by direct memory access (DMA).

* * * * *